United States Patent
Warner

(10) Patent No.: US 6,845,493 B2
(45) Date of Patent: Jan. 18, 2005

(54) ELECTRICAL LINE END SHORTENING QUANTIFICATION

(75) Inventor: Dennis J. Warner, Mechanicsville, VA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/414,387

(22) Filed: Apr. 15, 2003

(65) Prior Publication Data

US 2004/0210859 A1 Oct. 21, 2004

(51) Int. Cl.[7] ............................................. G06F 17/50
(52) U.S. Cl. ................................ 716/5; 716/4; 716/6
(58) Field of Search ........................... 716/1–6; 257/48, 257/315; 438/18, 597

(56) References Cited

U.S. PATENT DOCUMENTS

| | | | | |
|---|---|---|---|---|
| 5,751,015 A | * | 5/1998 | Corbett et al. ................ | 257/48 |
| 6,118,137 A | * | 9/2000 | Fulford et al. ................ | 257/48 |
| 6,391,669 B1 | * | 5/2002 | Fasano et al. ................ | 438/18 |
| 2003/0104685 A1 | * | 6/2003 | Reinberg ..................... | 438/597 |

* cited by examiner

Primary Examiner—Vuthe Siek
Assistant Examiner—Binh Tat
(74) Attorney, Agent, or Firm—Brinks Hofer Gilson & Lione

(57) ABSTRACT

The present invention enables the quantification of line end shortening by utilizing a pattern of multiple conductive paths, each conductive path can include a conductor at each end, each conductor connected to a separate contact with the contacts connected by a polysilicon conductor. The conductors can vary in length by a constant increment from conductive path to conductive path, beginning with a length that results in a significant overlap at the contacts to a length that results in a significant underlap at the contacts. Resistance measurements of each conductive path can be made until a change either to or from an "open" occurs; this is the point from which, using the constant increment, the LES can be characterized.

15 Claims, 3 Drawing Sheets

FIG. 4a
FIG. 4b
FIG. 4c
FIG. 4d
FIG. 4e
FIG. 4f
FIG. 4g
FIG. 4h
FIG. 4i
FIG. 4j
FIG. 4k
FIG. 4l
FIG. 4m
FIG. 4n
FIG. 4o
FIG. 4p

ELECTRICAL LINE END SHORTENING QUANTIFICATION

FIELD OF THE INVENTION

The invention relates generally to semiconductor manufacturing and, more particularly, to electrical line end shortening quantification.

BACKGROUND OF THE INVENTION

When a circuit is designed/drawn, the assumption is that the circuit can actually be produced as drawn. However, process effects cause distortion of the "drawn" image as it is printed on the wafer. One of the effects is line end shortening ("LES"), also known as line end pullback; it is a significant issue in microlithography. LES is a function of a variety of causes, including annularity (i.e., the exposure technique using apertures of various sizes and combinations of apertures), feature size, intensity flux (i.e., exposure in a given area), exposure, numerical aperture ("NA"), resist features (e.g., type, thickness, etc.), exposure wavelength, and focus (i.e., whether or not the image is in focus). LES usually occurs at the end of a feature in a lithography process (e.g., a line or space, rectangular in shape where the length is assumed to be longer than the width) and is visible in either polarity (i.e., either a positive or negative image of the feature). When LES occurs, the circuit may not be complete because all of its required contacts either have not been made at all or barely overlap which results in failures due to contact resistance issues.

Current LES quantification methods are non-electrical, time-consuming and expensive. For example, scanning electron microscope ("SEM") cross-sections are expensive and destroy the product. SEM cross-sections take a great deal of time to perform, thereby severely curtailing the number of measurement samples that can be made. Additionally, the accuracy of SEM cross-sections as applied to LES quantification is only about 5%. Another quantification method is SEM top-down. This method is also time-consuming and usually requires use of a manufacturing tool for extended periods of time in order to generate data.

It is therefore desirable to provide a solution that minimizes product loss and reduces the use of manufacturing tools, such as SEMs, in metrology. It is also desirable to provide a solution that enables the accumulation of enough data from each wafer/lot yield to improve data confidence. The present invention provides this in some embodiments by utilizing a pattern of incrementally length-modified conductive paths that each include pairs of conductors, each pair connected to respective contacts that are physically separated but electrically connected to one another. The conductors can vary in length by a constant increment, beginning with a length that results in a significant overlap at the contacts to a length that results in a significant underlap at the contacts. Resistance measurements of each conductive path can be made until a change either to or from an "open" occurs; this is the point from which, using the constant increment, the LES can be characterized.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which:

FIG. 4 diagrammatically illustrates an exemplary embodiment of incrementally modified conductors in accordance with the present invention.

DETAILED DESCRIPTION

While the making and using of various embodiments of the present invention are discussed herein in terms of resistance measurements and line length modification, it should be appreciated that the present invention provides many inventive concepts that can be embodied in a wide variety of contexts. The specific embodiments discussed herein are merely illustrative of specific ways to make and use the invention, and are not meant to limit the scope of the invention.

The present invention provides the ability to quantify line end shortening ("LES") by imprinting a pattern on a number of test wafers, the pattern can include multiple conductive paths, each successive conductive path having incrementally length-modified conductors, each conductor connected to a separate contact with the contacts connected by a polysilicon conductor. The pattern can begin with a conductor that significantly overlaps the contacts. The length of each conductor can differ from the length of the conductor of its neighboring conductive path by a constant increment, decreasing until the final conductor in the pattern significantly underlaps the contacts. Resistance measurements of each conductive path can be made until a change either to or from an "open" occurs; this is the point from which, using the constant increment, the LES can be characterized.

Figure 1:
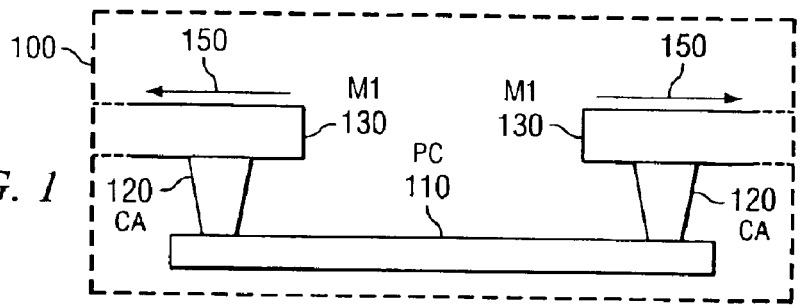
FIG. 1 diagrammatically illustrates a side view of pertinent portions of a pattern based on a semiconductor design in which line end shortening can occur.
Figure 2:
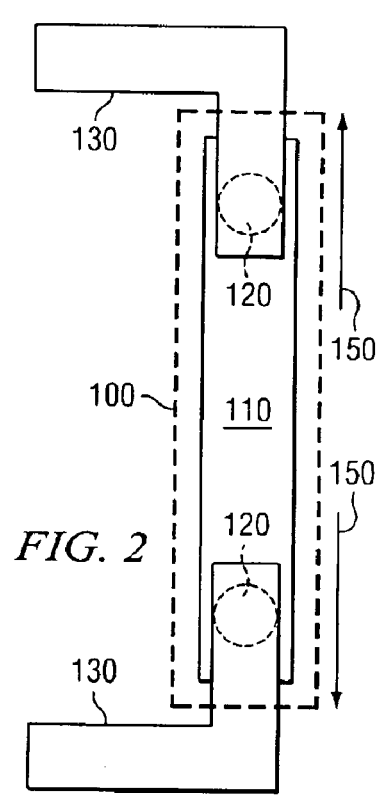
FIG. 2 diagrammatically illustrates a top down view of pertinent portions of a pattern based on a semiconductor design in which line end shortening can occur.

FIG. 1 diagrammatically illustrates a side view 100 of pertinent portions of a pattern based on a semiconductor design in which line end shortening can occur. In a given pattern, a conductive path exists from a first metal conductor ("M1") 130 to its contacting contact ("CA") 120, through polysilicon conductor ("PC") 110 to a second contact CA 120 and its contacting M1 130. As long as there is a complete conductive path, there is a relatively small resistance value. When LES occurs, each M1 130 can shorten in the direction indicated by the LES direction arrow 150 above that M1 130. When an M1 130 shortens enough to lose contact with CA 120, the resistance goes to a large "open" value because the conductive path is incomplete. By determining at which point the resistance between the M1s goes to an "open," the LES for that design can be calculated. FIG. 2 diagrammatically illustrates a top down view of FIG. 1.

Figure 3:
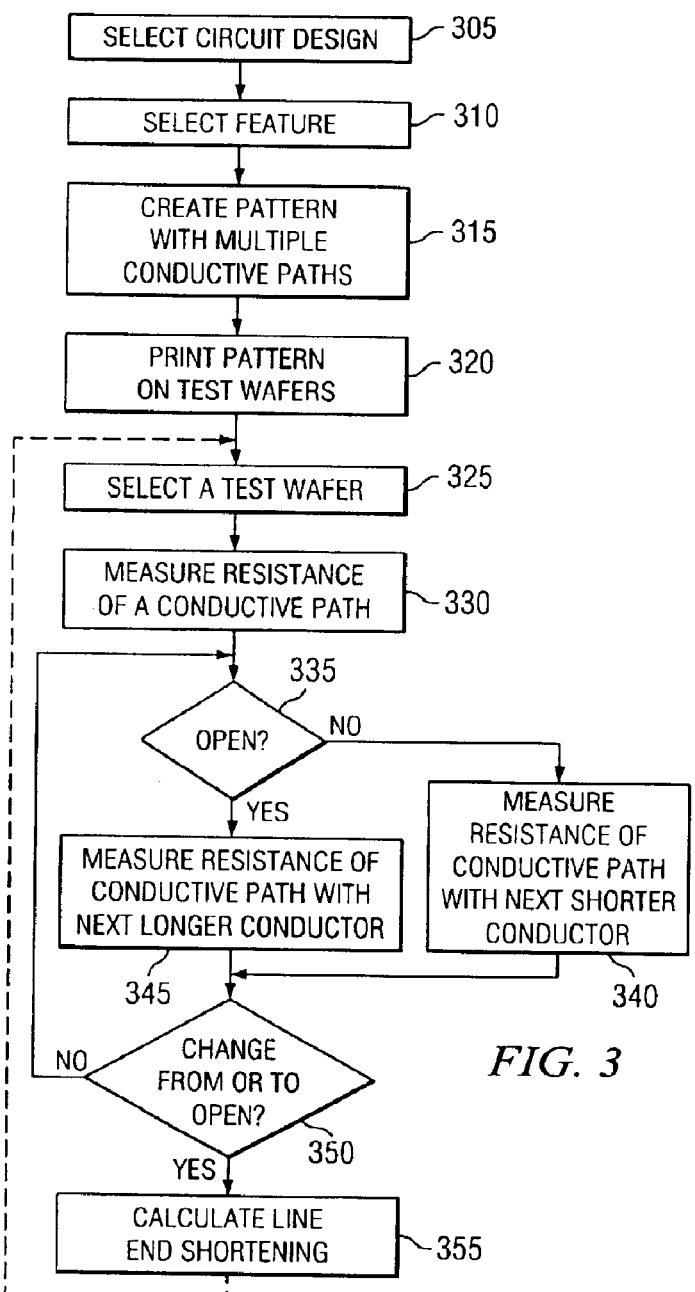
FIG. 3 illustrates an exemplary flow diagram for quantifying line end shortening in accordance with the present invention.

FIG. 3 illustrates a flow diagram for an exemplary embodiment of quantifying line end shortening in accordance with the present invention. Starting by selecting a circuit design in block 305 and then, in block 310, selecting a feature within the circuit design, a pattern with multiple conductive paths including incrementally length-modified conductors can be created in block 315, each conductive path such as shown in FIGS. 1 and 2. Next, using conventional methods, the pattern is printed on multiple test wafers in block 320. A pattern-imprinted test wafer is selected in block 325. An initial conductive path resistance measurement is made in block 330. At decision point 335, a determination can be made as to whether or not the initial resistance measurement taken in block 330 indicates an "open." If the initial resistance measurement taken in block 330 does not indicate an "open," then a resistance measurement is made on the conductive path with the next shorter conductor in block 340. However, if the initial resistance measurement taken in block 330 indicates an "open," then a resistance measurement is made on the conductive path with the next longer conductor in block 345. At decision point 350, a determination is made as to whether or not there was a change either from or to an "open." If no change occurred, operations return to block 335. If a change occurred at decision point 350, the LES can be calculated in block 355. The operations of blocks 325–355 illustrated in FIG. 3 can be repeated, as indicated by broken line, for multiple wafers, thereby improving the "resolution" of the changeover point.

A pattern, such as that shown in FIG. 4 which illustrates conductive paths (a) through (p) with incrementally shortened conductors 130 in topdown view similar to FIG. 2, can be created and imprinted on test wafers in accordance with the operations of blocks 305–320 (FIG. 3). In practice, conductive paths (a) through (p) can be imprinted on test wafers in a single horizontal line. Each conductive path (a) through (p) includes two (2) conductors 130 which may be in contact with respective contacts 120 which are physically separated but connected by a polysilicon conductor ("PC") 110. In conductive path (a), conductors 130 overlap each contact 120 by a significant amount, such as 100 nanometers. In successive conductive paths (b) through (p), conductors 130 are incrementally shortened by a constant increment such as 10 nanometers, until, as illustrated by conductive path (p), conductors 130 underlap each contact 120 by a significant amount, such as 50 nanometers.

Figure 5:
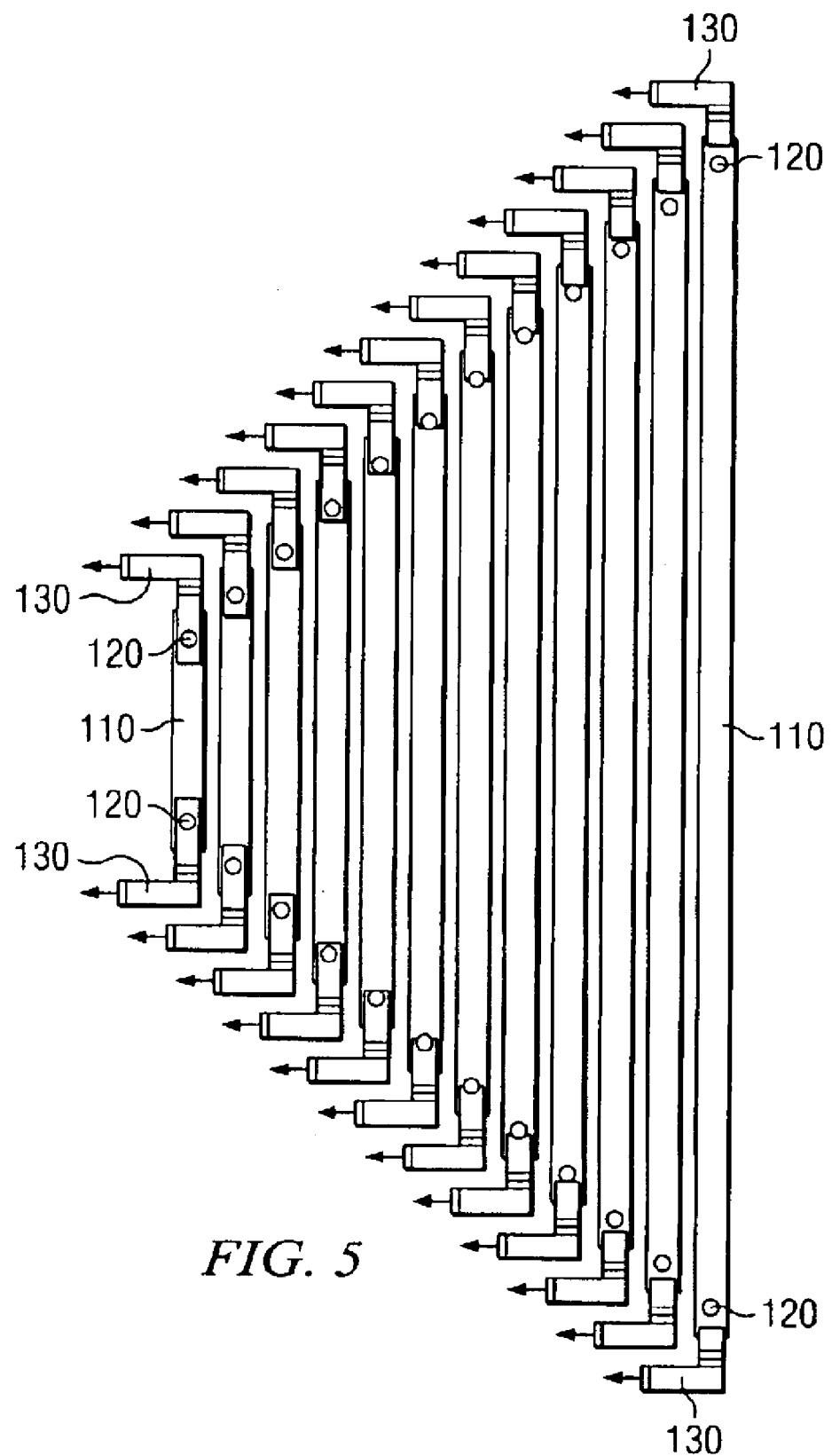
FIG. 5 diagrammatically illustrates an exemplary embodiment of incrementally modified conductors in accordance with the present invention.

Additionally, the length of PC 110 can be modified to minimize the area of the pattern, as illustrated by the exemplary embodiment of FIG. 5. In the exemplary embodiment of FIG. 5, the conductive path including the shortest PC 110 corresponds to conductive path (a) of FIG. 4 and the conductive path including the longest PC 110 corresponds to conductive path (p) of FIG. 4. This correspondence is based on the amount of overlap between conductors 130 and contacts 120 and is independent of the length of PC 110.

The operations of blocks 325–355 (FIG. 3) can be performed on a test wafer imprinted with a pattern of conductive paths such as conductive paths (a) through (p) illustrated in FIG. 4 or the conductive paths as illustrated in FIG. 5. With reference to FIG. 4, after selecting a test wafer (block 325, FIG. 3), the resistance measurement of block 330 (FIG. 3) can be performed on one of conductive paths (a) through (p), starting, for example, with conductive path (a). Because conductive path (a), as illustrated in FIG. 4, is significantly overlapped, no "open" will exist at decision point 335 (FIG. 3). Therefore, resistance measurements will be made consecutively on the remaining conductive paths, in order of decreasing length, until a resistance measurement indicates that an "open" exists.

As an example, with reference to FIG. 4, assume that conductive path (a) is designed to overlap by 100 nanometers, conductive path (p) is designed to underlap by 50 nanometers, and the increment between consecutive conductive paths (a) through (p) is 10 nanometers. Therefore, a scale with 16 increments is created. For purposes of exposition, assume that the first resistance measurement is made on conductive path (a) and successive resistance measurements are made on each consecutive conductive path (b) through (p) until an "open" occurs. If the resistance measurements indicate that contact is lost (i.e., an "open" occurs) at the fifth resistance measurement (e.g., conductive path (e) in the exemplary embodiment of FIG. 4), it can be concluded that the 60 nanometer overlap of conductive path (e) does not provide sufficient contact. In other words, although the design indicates a 60 nanometer overlap, when imprinted on a wafer, LES causes an underlap. This indicates that the particular feature in question (e.g., a line) needs a design extension (e.g. 70 nanometers) to compensate for LES, or other suitable line extension end treatments for compensation.

Additional resistance measurements made on other identically patterned test wafers can improve the "resolution" of the breakpoint. For example, on one (1) pattern-imprinted test wafer, resistance measurements of the fifth conductive path might indicate the first "open" while on a second identically patterned test wafer, resistance measurements of the sixth conductive path might indicate the first "open." Because each additional measurement approximates the amount of LES that occurs for the specific feature in the design layout, the more pattern-imprinted test wafers measured, the better the resolution. The increment (e.g. 1–16 in FIG. 4) at which the resistance measurements indicate an "open" would not vary by a significant amount from test wafer to test wafer. Therefore, if, for example, resistance measurements of the fifth conductive path indicated an "open" on one (1) pattern-imprinted test wafer and resistance measurements of the twelfth conductive path indicated an "open" on a second, identically patterned test wafer, a problem other than, or in addition to, LES would exist.

After determining the design extension needed to compensate for LES, as described above, conventional design software can be used to modify the original circuit design to include the extension prior to imprinting production wafers with the circuit design. For example, if the required design extension for the selected feature (block 310, FIG. 3) is 70 nanometers, then the feature in the original circuit design can be extended by 70 nanometers using any conventional model-based software, or where applicable, suitable line end treatments if design or mask-making rules do not allow simple line extensions. The modified circuit design can then be used in wafer production.

In some exemplary embodiments, a pattern, such as the pattern illustrated by FIG. 5, can be duplicated on a reticle, such that the duplicate pattern is rotated ninety degrees relative to the primary pattern. Both patterns can then be simultaneously imprinted on a substrate. The operations of blocks 325–355 (FIG. 3) can be performed on a test wafer double-patterned thusly. In this manner, not only can lengthwise parameters of a given line (such as LES) be quantified, but also other parameters, such as displacement of the line (e.g., from right to left in FIG. 5), can be determined.

Although exemplary embodiments of the present invention have been described in detail, it will be understood by those skilled in the art that various modifications can be made therein without departing from the spirit and scope of the invention as set forth in the appended claims.

What is claimed is:

1. A method for preparing a semiconductor substrate for use in characterizing line end shortening associated with integrated circuit fabrication, the method comprising:

providing on the semiconductor substrate a plurality of conductive paths which each has at least one contact portion;

for each of said conductive paths, designing an associated line end structure corresponding to an integrated circuit design, including designing each said line end structure such that, when provided on the semiconductor substrate, the line end structure is expected to contact only a predetermined amount of the contact portion of the associated conductive path, wherein the predetermined amount associated with each said line end structure differs from the predetermined amount associated with each remaining said line end structure;

providing the line end structures on the semiconductor substrate;

sequentially measuring conductivity between each of said conductive paths and the associated line end structure; and calculating line end shortening according to a change of measured conductivity between at least two sequential conductivity measurements, wherein at least one of the at least two sequential conductivity measurements includes a measurement of a substantially open-circuit.

2. The method of claim 1 wherein the predetermined amount associated with each said line end structure differs from the predetermined amounts associated with each remaining said line end structure by respective multiples of a predetermined difference amount.

3. The method of claim 2 wherein the predetermined difference amount is 10 nanometers.

4. The method of claim 1 wherein said providing step includes providing a further said conductive path, and said designing step includes designing a further said line end structure such that, when provided on the semiconductor substrate, said further line end structure is not expected to contact the contact portion of the further conductive path.

5. The method of claim 1 wherein the predetermined amount associated with one of said line end structures is 100 nanometers.

6. The method of claim 5 wherein said providing step includes providing a further said conductive path, and said designing step includes designing a further said line end structure such that, when provided on the semiconductor substrate, said further line end structure is expected to be separated from the contact portion of the further conductive path by 50 nanometers.

7. The method of claim 1 wherein said plurality of conductive paths are all of substantially equal length.

8. The method of claim 1 wherein said plurality of conductive paths are of mutually differing lengths.

9. An apparatus for use in characterizing line end shortening associated with integrated circuit fabrication, comprising:

a semiconductor substrate;

a plurality of conductive paths provided on said semiconductor substrate, each of said conductive paths having a contact portion; and a plurality of line end structures provided on said semiconductor substrate and corresponding to an integrated circuit design, said line end structures respectively associated with said conductive paths, each said line end structure having been designed such that, when provided on the semiconductor substrate, the line end structure is expected to contact only a predetermined amount of the contact portion of the associated conductive path, at least one said line end structure contacting the contact portion of the associated conductive path, and wherein the predetermined amount associated with each said line end structure differs from the predetermined amount associated with each remaining said line end structure, the apparatus configured to sequentially measure conductivity between each of said conductive paths and the associated line end structure, and to calculate line end shortening according to a change of measured conductivity between at least two sequential conductivity measurements, wherein at least one of the at least two sequential conductivity measurements includes a measurement of a substantially open-circuit.

10. The apparatus of claim 9 wherein the predetermined amount associated with each said line end structure differs from the predetermined amounts associated with each remaining said line end structure by respective multiples of a predetermined difference amount.

11. The apparatus of claim 10 wherein the predetermined difference amount is 10 nanometers.

12. The apparatus of claim 9 wherein one of said line end structures is separated from the contact portion of the associated conductive path.

13. The apparatus of claim 9 wherein the predetermined amount associated with one of said line end structures is 100 nanometers.

14. The apparatus of claim 9 wherein said plurality of conductive paths are all of substantially equal length.

15. The apparatus of claim 9 wherein said plurality of conductive paths are of mutually differing lengths.

* * * * *